United States Patent [19]
Goedbloed

[11] 3,808,555
[45] Apr. 30, 1974

[54] SEMICONDUCTOR DEVICE FOR PRODUCING HIGH-FREQUENCY ELECTRIC OSCILLATIONS

[75] Inventor: Jasper Jan Goedbloed, Emmasingel, Eindhoven, Netherlands

[73] Assignee: U.S. Philips Corporation, New York, N.Y.

[22] Filed: Feb. 24, 1972

[21] Appl. No.: 229,148

[30] Foreign Application Priority Data

Mar. 10, 1971 Netherlands ....................... 7103156

[52] U.S. Cl. ....... 331/107 R, 317/235 K, 317/235 T
[51] Int. Cl. ............................................... H01l 9/10
[58] Field of Search.. 331/107 R; 317/235 K, 235 T

[56] References Cited

UNITED STATES PATENTS 3,602,840 8/1971 Nishizawa et al. .............. 317/235 L

OTHER PUBLICATIONS

Classen et al., "Field Emission Controlled Transist Time Neg. Resist", Electronics Letters, pp. 512–513, Vol. 6, No. 16, 6 Aug. 1970.

Ulrich, "AM Noise of IMPATT Diode Oscillators", Electronic Letters, Vol. 6, No. 8, 6 April 1970, pp. 247–248.

*Primary Examiner*—Rudolph V. Rolinec
*Assistant Examiner*—William D. Larkins
*Attorney, Agent, or Firm*—Frank R. Trifari; Jack Oisher

[57] ABSTRACT

A semiconductor device having an avalanche-transit time diode for producing high frequency electric oscillations is described in which according to the invention the diode, to obtain a minimum FM noise level, is operated so that the transit time or phase shift in radians lies between 4 and 5.2.

8 Claims, 3 Drawing Figures

SEMICONDUCTOR DEVICE FOR PRODUCING HIGH-FREQUENCY ELECTRIC OSCILLATIONS

Figure 1:
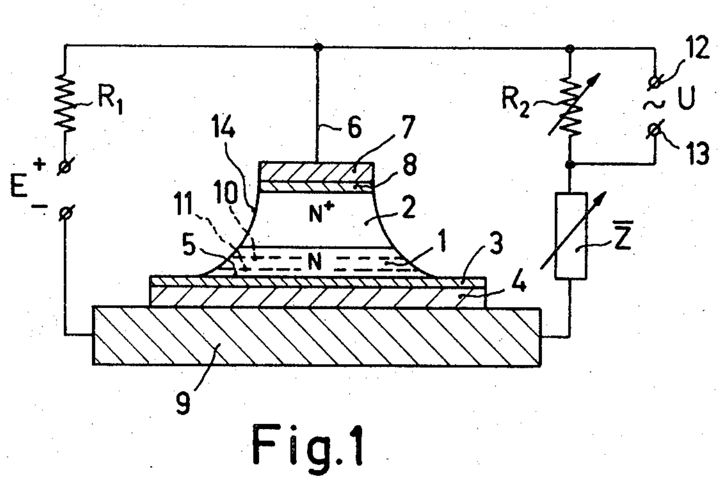

The invention relates to a semiconductor device for producing high frequency electric oscillations comprising an avalanche transit time diode having a body comprising a first region of a semiconductor material of a first conductivity type and a second region of a material which forms an abrupt rectifying junction with the first region, the first and the second region comprising connection conductors destined to apply such a high voltage in the reverse direction across the rectifying junction that avalanche multiplication of charge carriers occurs with said junction, an output signal of a given frequency being derivable between said connection conductors.

An abrupt rectifying junction is to be understood to mean such an asymmetric junction that, when a voltage in the reverse direction is applied across said junction, the depletion zone extends substantially only in the said first region.

Semiconductor devices having avalanche transit time diodes (IMPATT-diodes) of the described type are known. For producing electroc oscillations, said devices use the negative differential resistance which is produced in an avalanche transit time diode by avalanche multiplication within an avalanche region in the proximity of the rectifying junction as a result of impact ionisation in the semiconductor material, combined with the transit time of the majority charge carriers through the drift region, that is to say the region outside the avalanche region where the field strength is at least equal to the saturation field strength, so that the charge carriers traverse the said region at a saturation drift rate which is characteristic of the relevant type of charge carriers (electrons or holes) and of the semiconductor material used.

The oscillation frequency ($f$) of the avalanche transit time diode is determined by the diode parameters (structure, doping, dimensions) and by the choice of external impedance applied across the diode in the circuit used.

It is furthermore known that the output power of an avalanche transit time diode having a given structure and proportioning to be derived maximum between the connection conductors depends considerably on the oscillation frequency chosen. In connection herewith, the oscillation frequency for a given avalanche transit time diode is generally chosen in connection with the diode parameters so that the resulting output power is maximum. It can be calculated (see Delage-beaudeuf, l'Onde Electrique, vol. 48, 1968, p. 724 formula (2)) that this is the case when the transit angle $\theta = 2\pi f\, l_d/v$ is approximately $3\pi/4 = 2.4$ radians, wherein $f$ is the oscillation frequency, $v$ the saturation drift velocity of the majority charge carriers and $l_d$ is the length of the said drift region. On the basis of this consideration a certain avalanche transit time diode is nearly always used in practice within a given frequency range in which the output power is optimum.

A known drawback of the described device, however, is the comparatively high level of the oscillator noise, caused in particular by the vehement impact ionisation. Of this noise which can be discriminated in AM (amplitude modulation) noise and FM (frequency modulation) noise, it is in particular the FM noise that is very detrimental to many applications, for example as "local oscillator" or signal generator.

It is one of the objects of the invention to provide a device of which the structure and the proportioning in the operating conditions chosen give rise to a minimum FM noise level.

The present invention is inter alia based on the recognition of the fact that for applications for which reaching a minimum FM noise level is of great importance, an oscillation frequency is advantageously chosen which differs from the frequency at which a maximum output power is obtained.

The invention is furthermore based on the recognition of the fact that for a given avalanche transit time diode the FM noise level shows a minimum for a given optimum oscillation frequency which is determined by the diode parameters, in which nevertheless the output power, although not maximum, has a value which is acceptable for many applications, A semiconductor device of the type mentioned in the preamble is therefore characterized according to the invention in that the oscillation frequency with respect to the diode parameters is chosen to be so that the value of the transit angle $$\theta = 2\pi f\, l_d/v$$

is at least 4 radians and at most 5.2 radians, wherein $f$ is the oscillation frequency of the avalanche transit time diode, $v$ the saturation drift velocity of majority charge carriers in the first region, and $l_d$ is the length of the part of the first region traversed by said charge carriers at the saturation drift velocity, the drift region.

It is found that at values of the above defined transit angle between the indicated limits the FM noise for the semiconductor materials conventionally used for the manufacture of avalanche transit time diodes, for example silicon, germanium and gallium arsenide, has a relatively very low value and in addition shows a minimum between the indicated limits of the transit angle. It is found that this minimum occurs at a value of the transit angle of approximately 4.6 radians so that the relationship between $f$, $l_d$ and $v$ is preferably chosen to be so that $$\theta = 2\pi f\, l_d/v$$

is substantially equal to 4.6 radians.

For a given type of charge carriers (electrons or holes) and for a given semiconductor material, the saturation drift velocity $v$ has a given value and is, for example, for electrons in germanium approximately $6.10^6$ cm $sec^{-1}$ and for silicon $10^7$ cm.$sec^{-1}$ at field strengths greater than the saturation field which for germanium is approximately $3.10^3$ volt $cm^{-1}$ and for silicon approximately $2.10^4$ volt.$cm^{-1}$.

The length $l_d$ of the drift region can be calculated for any diode from the doping profile of the diode and the breakdown voltage of the rectifying junction. In the usual types of avalanche transit time diodes of the kind described, the length $l_d$ is associated in a simple manner with other quantities to be measured directly on the diode.

In a known type of avalanche transit time diode, the so-called "Read" diode, the first region comprises a highly doped zone adjoining the rectifying junction, the avalanche region, within which avalanche multiplication occurs, and a low-doped drift region which adjoins said zone and in which the doping is so low that the electric field strength within said drift region, when a reverse voltage is applied, is equal to the breakdown voltage across the rectifying junction above the saturation field strength. According to a further important preferred embodiment, the avalanche transit time diode therefore is a Read diode, in which the first region comprises a highly doped avalanche region which adjoins the rectifying junction and a lower-doped drift region which adjoins said avalanche region.

In another type of an avalanche transit time diode, at least a zone of the first region adjoining the rectifying junction has a doping which is substantially homogeneous and has such a value that, when a reverse voltage is applied across the rectifying junction which is equal to or slightly larger than the breakdown voltage, the depletion zone belonging to the rectifying junction extends within the first region not farther than the said homogeneously doped zone. In that case it appears from measurements that the length $l_d$ of the drift region is approximately equal to two-thirds of the thickness of the depletion zone occurring at the breakdown voltage of the rectifying junction. It can be calculated that the thickness of said depletion zone (in $m$) is equal to $$\sqrt{(2\,\epsilon_o\,\epsilon_r/qN')\,V_B}$$

wherein $\epsilon_o$ is the dielectric constant of the vacuum = $8.854.10^{-12}$ Farad $m^{-1}$, $\epsilon_r$ is the relative dielectric constant of the semiconductor material, $q$ is the charge of the electron = $1.6.10^{-19}$ Coulomb, $N'$ is the doping of the said homogeneous zone in atoms $m^{-3}$, and $V_B$ is the breakdown voltage of the rectifying junction in volts.

In accordance with the above $$\sqrt{(2\,\epsilon_o\,\epsilon_r/qN')\,V_B} \leq d', \qquad (1)$$

wherein $d'$ is the thickness of the homogeneously doped zone (in $m$), and $$l_d = \tfrac{2}{3}\,\sqrt{(2\,\epsilon_o\,\epsilon_r/qN')\,V_B}, \qquad (2)$$

whereas according to the invention $$4 \leq 2\pi f\,l_d/v \leq 5.2 \qquad (3)$$

From equations 2 and 3 it follows, while observing the above numerical values for $\epsilon_o$ and $q$, that $$9.1.10^{-4}\,v\,\sqrt{N/\epsilon_r\,V_B} \leq f \leq 1.18.10^{-3}\,v\,\sqrt{N/\epsilon_r\,V_B} \qquad (4)$$

wherein $v$ = the saturation drift velocity of the majority charge carriers in the semiconductor material in cm.sec.$^{-1}$ $N$ = the doping concentration in atoms.cm$^{-3}$ From equation 1 it furthermore follows that $$d \geq 1.05.10^{-3}\,\sqrt{\epsilon_r\,V_B/N}$$

($d$ in cm, $N$ in atoms.cm$^{-3}$).

A further important preferred embodiment according to the invention is therefore characterized in that the first region comprises a substantially homogeneously doped zone which adjoins the rectifying junction and the thickness of which in cm is at least equal to $$1.05.10^{3}\,\sqrt{\epsilon_r\,V_B/N}$$

while the oscillation frequency is at least equal to $$9.1.10^{-4}\,v\,\sqrt{N/\epsilon_r\,V_B}$$

and at most equal to $$1.18.10^{-3}\,v\,\sqrt{N/\epsilon_r\,V_B}$$

and preferably substantially equal to:

$$1.05.10^{-3}\,v\,\sqrt{N/\epsilon_r\,V_B}$$

The rectifying junction can be realized in various manners. According to a preferred embodiment the rectifying junction is a p-n junction between the first region of the first conductivity type and the second region of a semiconductor material of the second opposite conductivity type having a higher doping concentration than the part of the first region adjoining the p-n junction. The first and the second region may consist of different semiconductor materials, the rectifying junction being a so-called hetero junction.

According to an important preferred embodiment, however, the first and the second region consist of the same semiconductor material but are of opposite conductivity types.

According to another preferred embodiment, the second region consists of a metal which forms a rectifying metal - semiconductor junction (Schottky junction) with the first region.

The semiconductor material of at least the first region consists preferably of silicon, germanium or gallium arsenide, although in certain circumstances other semiconductor materials may also be considered.

An avalanche transit time diode for use in a device according to the invention may of course show any structure used in known avalanche transit time diodes and may be manufactured, for example, according to the known mesa or planar methods while using known methods such as methods of alloying, diffusion or ion implantation, whether or not using epitaxial growing.

Figure 2:
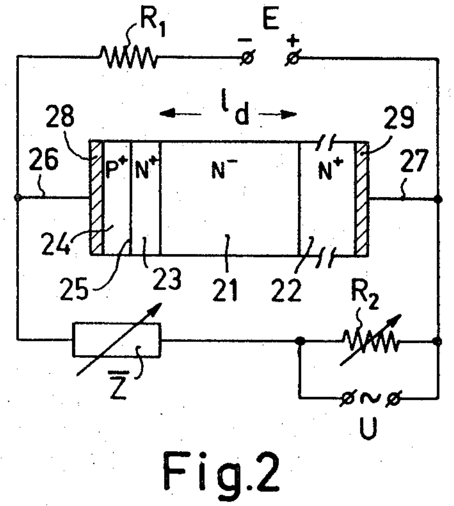
Figure 3:
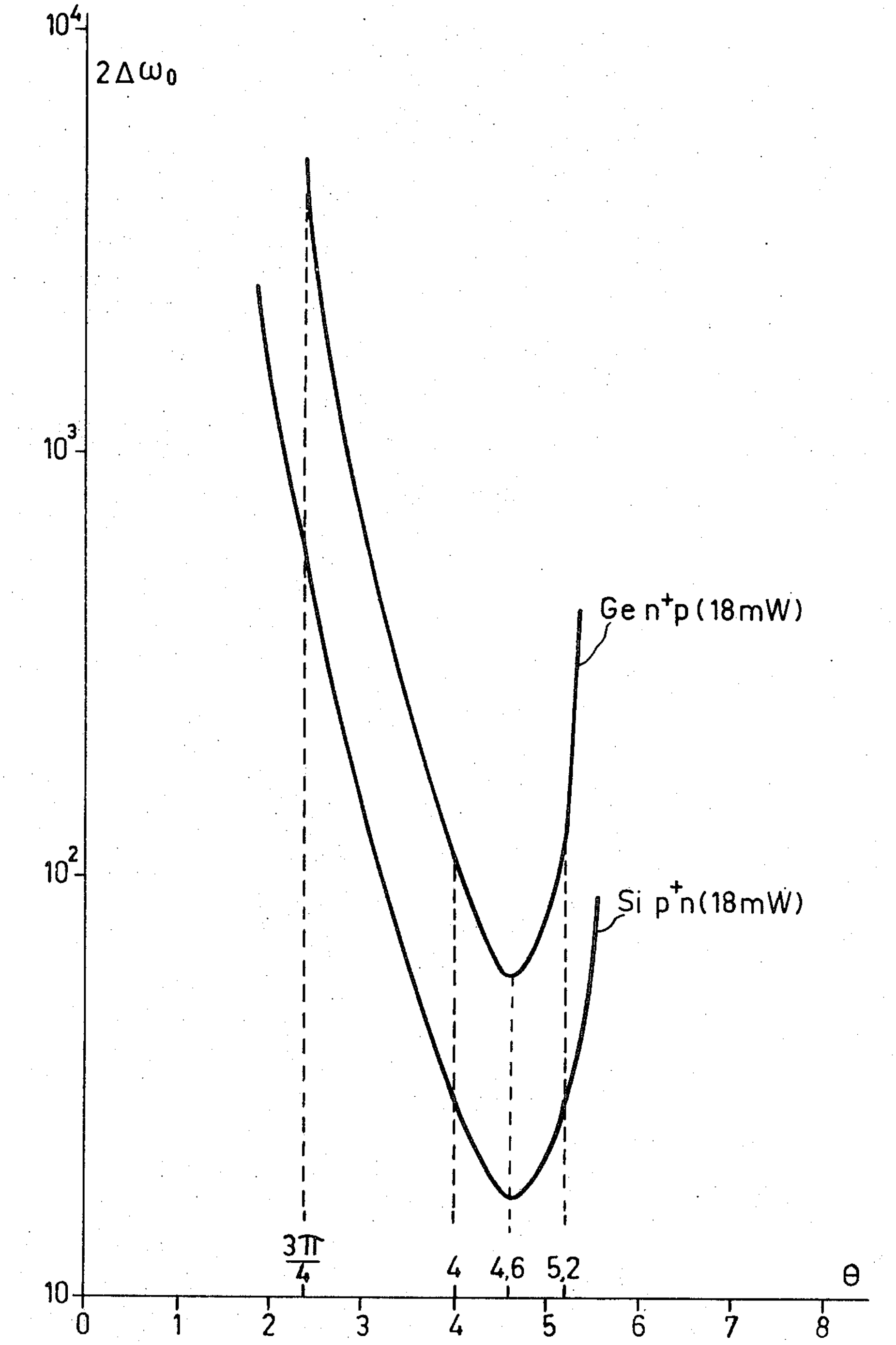

In order that the invention may be readily carried into effect, a few embodiments thereof will now be described in greater detail, by way of example, with reference to the accompanying drawings, in which FIG. 1 shows a device according to the invention, FIG. 2 shows another device according to the invention, FIG. 3 shows the variation of the half width $2\,\Delta\,\Omega_o$ of the angular frequency as a function of the transit angle $\theta$ for an output power of 18 $mw$ and for two different semiconductor materials.

The Figures are diagrammatic and not drawn to scale; corresponding parts in the Figures are generally referred to by the same reference characters.

FIG. 1 shows diagrammatically and, as far as the avalanche transit time diode is concerned, in a cross-sectional view, a semiconductor device according to the invention for producing high frequency electric oscillations. The device comprises an avalanche transit time diode having a body comprising a first region (1,2) of n-type silicon which consists of an epitaxial layer 1, 7 microns thick and a doping of $5.10^{15}$ phosphorus atoms per $cm^3$ (resistivity 1.1 ohm.cm) which is provided on a substrate 2, 50 microns thick, resistivity 0.008 ohm.cm (doping $8.10^{18}$ antimony atoms per $cm^3$) The diode furthermore comprises a second region in the form of a metal layer consisting of a layer 3 of palladium, 0.1 micron thick, and a layer 4 of gold, 0.5 micron thick. The palladium layer 3 constitutes an abrupt rectifying Schottky junction 5 with the part 1 of the first region. The part 2 of the first region comprises a connection conductor 6 which contacts the substrate 2 by means of a gold layer 7 and a palladium layer 8 of the same thicknesses as the layers 4 and 3. The second region consisting of the metal layer (3,4), comprises a connection conductor in the form of a copper cooling plate 9 on which the layers 3 and 4 are provided.

By means of a direct voltage source E having a high-value internal resistor $R_1$, a voltage is applied in the reverse direction across the rectifying junction 5 via the connection conductors 6 and 9, which voltage is equal to or slightly greater than the breakdown voltage $V_B$ of the junction. In the present case this voltage is approximately 100 volt.

As a result of the application of said direct voltage, avalanche multiplication occurs in the layer 1 in the proximity of the junction 5, as a result of which electrons and holes are formed. The electrons move through the layer 1 in the direction from the palladium layer 3 to the $N^+$ layer 2 under the influence of the electric field.

Incorporated in the circuit are furthermore a variable resistor $R_2$ and a variable impedance $\bar{Z}$ (having a real and an inductive imaginary part) which are connected in series between the connection conductors 6 and 9. By controlling $R_2$ and Z so that $R_d + jx_d + R_2 + \bar{Z} = 0$, wherein $R_d + jX_d$ is the internal impedance of the avalanche transit time diode between the conductors 6 and 9, the diode can be made to oscillate by the known interaction between impact ionisation and electron transit time, an output signal U being derived via the resistor $R_2$ between the terminals 12 and 13. By varying $R_2$ and $\bar{Z}$ while observing the above-stated condition, the frequency $f$ of the signal U can be varied.

For silicon $\epsilon_r = 12$, while the saturation drift velocity of electrons in silicon is $10^7$ $cm.sec^{-1}$. The thickness of the homogeneously doped zone 1 of the first region adjoining the junction 5 is $7.10^{-4}$ cm which is more than $$1.05.10^3 \quad \sqrt{\epsilon_r V_B/N} = 5.15.10^{-4} \text{ cm},$$

which is the thickness of the depletion zone at the breakdown voltage of the junction 5. The boundary of said depletion zone is denoted in FIG. 1 by the broken line 10.

According to the invention, the frequency $f$ is chosen to be so that the transit angle $$\theta = 2\pi f\, l_d / v$$

is at least 4 and at most 5.2 radians and preferably is 4.6 radians. For the diode described, the length $l_d$ of the drift region is, to a good approximation, equal to two-thirds of the thickness of the depletion zone, so $$l_d = ⅔ \cdot 1.05.10^3 \quad \sqrt{\epsilon_r V_B/N} = 3.44.10^{-4} \text{ cm}.$$

The drift region in FIG. 1 is present between the broken lines 10 and 11. From the said condition for $\theta$ it consequently follows that $$1.86.10^{10} \text{ sec}^{-1} = 9.1.10^{-4}\, v \quad \sqrt{N/\epsilon_r V_B} \leq f \leq 241.18.10^{-3} v$$

$$\sqrt{N/\epsilon_r V_B} = 2.41.10^{10} \text{ sec}^{-1}$$

and preferably ($\theta = 4.6$):

$$f = 1.05.10^{-3}\, v \quad \sqrt{N/\epsilon_r V_B} = 2.14.10^{10} \text{ sec.}^{-1}.$$

FIG. 3 shows the variation of the FM noise level as a function of the transit angle $\theta$, for an overall output power (via $R_2 + \bar{Z}$) of 18 m$W$, for a germanium $n^+p$-diode and for a silicon $p^+n$ (respectively metal-n) diode. The half width $2\,\Delta\,\Omega_o$ of the oscillation angular frequency in radians/sec is plotted on the vertical axis as a measure of the noise, while the transit angle in radians is plotted on the horizontal axis. As shown in FIG. 3, the FM noise has a minimum between the limits chosen at $\theta = 4.6$. In order to obtain a maximum output power, the transit angle to be chosen should be $\theta = 3\pi/4$ corresponding to a frequency $f = 4.65.10^{10}$ $sec^{-1}$. From FIG. 3 it appears, however, that for this frequency the noise level expressed in the half width is more than a factor 20 higher than at the optimum frequency according to the invention.

The diode shown in FIG. 1 can be manufactured according to the generally used methods in which the layer 1 is provided on the substrate 2 by epitaxial growing after which the palladium and gold layers 3, 4, 7 and 8 are vapor-deposited and the resulting plate is subdivided into individual diodes by masking and etching. During etching, the profile of the edge 14 (see FIG. 1) which is advantageous to obtain a maximum breakdown voltage is obtained. The manufacture of such as avalanche transit time diode is described in detail in co-pending Patent application, Ser. No. 174,886, filed Aug. 25, 1971.

Instead of by the palladium-gold layer (3,4) the rectifying junction may also be constituted by a strongly P-doped layer adjoining the layer 1, as described, for example, in "Electronics Letters", Dec. 27, 1969, pp. 693–694.

FIG. 2 is a diagrammatical cross-sectional view of another example of a device according to the invention having an avalanche transit time diode of the Read type which is further incorporated in a circuit in the same manner as described in the preceding example, The diode has a semiconductor body of silicon with a first n-type region which comprises a substantially homogeneously doped drift region 21 having a doping of $7.10^{14}$ antimony atoms per $cm^3$ and a thickness $l_d$ = 9.3 microns, which is provided in the form of an epitaxial layer on a substrate 22 with a doping of $10^{18}$ antimony atoms per $cm^3$. The first region furthermore comprises a highly doped n-type layer 23, the avalanche region, which is provided in the epitaxial layer 21 by a phosphorus diffusion in a thickness of 2.4 microns. The second region 24 consists of a P-type layer, 5.3 microns thick, which is provided by means of a boron diffusion and forms a rectifying p-n junction 25 with the layer 23. The surface concentration of the phosphorus diffusion at the area of the surface of the layer 24 is $10^{17}$ $at.cm^{-3}$ and that of the boron diffusion $4.10^{20}$ $cm^{-3}$.

The regions 24 and 22 are provided with connection contacts by means of metal layers 28 and 29 and connection conductors 26 and 27, the layer 28 being preferably provided on a cooling plate. The structure of the diode is shown diagrammatically in the Figure since only the succession and thicknesses of the layers are of importance to illustrate the invention. For example, the diode may be constructed in a form analogous to that shown in FIG. 1. The breakdown voltage of the p-n junction 25 is 50 volts.

According to the invention, the frequency is controlled in the manner indicated in the previous example so that $$4 \leq 2\pi f\, l_d/v \leq 5.2$$

and preferably so that $$2\pi f\, l_d/v \approx 4.6.$$

In a diode of this type, $l_d$ is substantially equal to the thickness of the layer 21 so that the frequency to be chosen is substantially independent of the doping of the various layers provided only that the conditions to be imposed upon any Read diode are met, namely, that the p-n junction 25 is abrupt and that at the breakdown voltage of the junction 25 the space charge region extends at least up to the layer 22 while in the region 21 the field strength is greater than the saturation field strength. It has been found that these conditions are met with the doping profile described.

Since $l_d = 9.3.10^{-4}$ cm, it follows from the above that $$6.8.10^9 \text{ sec}^{-1} \leq f \leq 8.9.10^9 \text{ sec}^{-1}$$

and preferably $f = 7.9.10^9$ sec.$^{-1}$.

It will be obvious that the invention is not restricted to the embodiments described but that many variations are possible to those skilled in the art without departing from the scope of this invention. For example, the P-type layer 24 of the avalanche transit time diode shown in FIG. 2 may also be replaced by a metal layer which forms a rectifying Schottky junction with the layer 23. Furthermore, semiconductor materials other than silicon, for example, germanium or gallium arsenide, may be used. The conductivity types of the semiconductor layers may be replaced by their opposite conductivity types while observing the conditions underlying the invention. Other metals which are suitable for that purpose may be used to form Schottky junctions, while the external circuit may also differ in components from the circuit described in the example, and structures other than mesa structures, for example, fully or partly planar structures, may also be used for the avalanche transit time diode.

It is of importance to note that, although in the preceding paragraphs start is made from a given avalanche transit time diode of which the oscillation frequency was then chosen according to the transit angle condition of the invention, there may be started, instead of this, from a given desirable oscillation frequency on the basis of which is then used an avalanche transit time diode of such a structure that the saturation drift velocity $v$ and the length $l_d$ of the drift region are in agreement with the conditions imposed upon the transit angle according to the invention. For a given semiconductor material of the first region the measure according to the invention inter alia means that, in order to obtain a minimum FM noise for a given oscillation frequency, a diode will be chosen having a longer drift region or a higher breakdown voltage than was usual so far.

What is claimed is:

1. A semiconductor device for producing high frequency electric oscillations comprising an avalanche transit time diode having a body comprising a first region of a semiconductor material of a first conductivity type and a second region of material which forms an abrupt rectifying junction with the first region, connections to the first and the second regions to apply such a high voltage in the reverse direction across the rectifying junction that avalanche multiplication of charge carriers occurs in the vicinity of said junction and majority carriers are caused to drift at their saturation drift velocity $v$ through a drift region having a length $l_d$ which is a part of the first region, and load means for deriving an output signal from between said connections, said load means having a value in combination with the diode parameters such that the frequency $f$ at which said device oscillates has a value at which the transit angle $\theta$ for the charge carriers traversing the drift region is between 4 radians and 5.2 radians, where $$\theta = 2\,\pi f\, l_d/v.$$

2. A semiconductor device as claimed in claim 1, wherein the value of the transit angle $\theta$ is substantially equal to 4.6 radians.

3. A semiconductor device as claimed in claim 1, wherein the avalanche transit time diode is a Read diode in which the first region comprises a highly doped avalanche region which adjoins the rectifying junction and a lower-doped drift region which adjoins said avalanche region.

4. A semiconductor device as claimed in claim 1, wherein the first region comprises a substantially homogeneously doped zone which adjoins the rectifying junction and the thickness of which in cm is at least equal to $$1.05.10^3 \quad \sqrt{\epsilon_r V_B / N}, \text{ and}$$

the oscillation frequency is at least equal to $$9.1.10^{-4} v \quad \sqrt{N/\epsilon_r V_B}$$

and at most equal to $$1.18.10^{-3} v \quad \sqrt{N/\epsilon_r V_B}$$

wherein $v$ is the drift velocity of the majority charge carriers in said zone in cm.sec$^{-1}$, $N$ is the doping of the zone in atoms.cm$^{-3}$, $\epsilon_r$ is the relative dielectric constant of the semiconductor material of the zone, and $V_B$ is the breakdown voltage of the rectifying junction in volts.

5. A semiconductor device as claimed in claim 1 wherein the rectifying junction is a p-n junction between the first region of the first conductivity type and the second region of a semiconductor material of the second opposite conductivity type having a high doping concentration than the part of the first region adjoining the p-n junction.

6. A semiconductor device as claimed in claim 4 wherein the first region and the second region consist of the same semiconductor material but are of opposite conductivity types.

7. A semiconductor device as claimed in claim 1 wherein the said second region consists of a metal which forms a rectifying metal-semiconductor Schottky junction with the first region.

8. A semiconductor device as claimed in claim 1 wherein the semiconductor material of at least the first region consists of silicon, germanium or gallium arsenide.

* * * * *